United States Patent [19]

Matsushita et al.

[11] Patent Number: 5,201,005

[45] Date of Patent: Apr. 6, 1993

[54] SOUND FIELD COMPENSATING APPARATUS

[75] Inventors: Fumio Matsushita; Hiroshi Tsubonuma, both of Tokyo, Japan

[73] Assignee: Pioneer Electronic Corporation, Tokyo, Japan

[21] Appl. No.: 700,983

[22] Filed: May 16, 1991

[30] Foreign Application Priority Data

Oct. 12, 1990 [JP] Japan .................. 2-274503

[51] Int. Cl.⁵ .............................. H03G 3/00
[52] U.S. Cl. ........................... 381/63; 84/630
[58] Field of Search .......... 381/62, 63, 64, 17; 84/707, 708, 630, 631

[56] References Cited

U.S. PATENT DOCUMENTS 5,050,216 9/1991 Hanzawa et al. .................. 381/63
5,065,433 11/1991 Ida et al. .......................... 381/63

OTHER PUBLICATIONS

International Conference on Acoustics, Speech and Signal Processing, Apr. 16, 1983, Y. C. Lim et al., "Efficient FIR Filter Implementation Using Microprocessor," Apr. 16, 1983; pp. 443-446.

Patent Abstracts of Japan, vol. 13, No. 386 (E-812) Aug. 25, 1989.

Primary Examiner—Forester W. Isen
Attorney, Agent, or Firm—Sughrue, Mion, Zinn, Macpeak & Seas

[57] ABSTRACT

A sound field compensating apparatus is provided in which delay data produced by one of the delay means in a FIR filter, which is realized by the action of a DSP, is commonly used for producing a plurality of reflected sound data of corresponding channels. Accordingly, the maximum delay time of the delay data is lengthened without increasing the number of delay data retrieving actions per sampling period on the delay memory. Hence, an acceptable number of the reflected sound signals can be obtained for each channel.

3 Claims, 4 Drawing Sheets

SOUND FIELD COMPENSATING APPARATUS

BACKGROUND OF THE INVENTION

1. Field of the Invention

The present invention relates to a sound field compensating apparatus for producing a simulating reflected sound signal corresponding to a direct sound signal.

2. Description of the Related Art

There has been well known a sound field compensating apparatus for executing signal processes for a sound field control to audio signals so as to give presence in a home or vehicle by producing a sound field which is obtained by simulating the sound field in an acoustic space of a concert hall or a theater. Such a sound field compensating apparatus has a digital signal processor (abbreviated to DSP) which performs arithmetic processing of digital signals supplied from an audio signal source such as a tuner or the like. The DSP comprises a calculation section for performing arithmetic operation, e.g. multiplication, division, addition, and subtraction, and a storage section consisted mainly of a data memory for storage of digital audio signal data which are to be delivered to the calculation section, a coefficient memory for storage of coefficient data which is multiplied by the factor of the audio signal data, and other memories Also, it is provided with an external delay memory for delaying the signal data and a delay time memory for storage of delay time data which carry information of a duration from writing to reading of the signal data on the delay memory. In the operation of the DSP, the signal data are processed at high speeds through transfer of relevant data between the memories and from the memories to the calculation section in accordance with a processing program. For example, a signal data supplied by sampling is fed to the delay memory where it is delayed and shifted to a delay signal data. The delay signal data is then transferred via the data memory to the calculation selection where it is multiplied by the factor of a coefficient data to produce a simulating reflected sound data for compensation for sound level attenuation. In response to supply of one sampling signal data, a plurality of reflected sound data which are different in the delay time and the coefficient value are produced and added to an original sound data or input signal data as a direct sound data. A resultant signal adding both the input sound data and the reflected sound data is then output from the DSP and converted to an analog signal for driving a speaker.

However, the conventional sound field compensating apparatus employing a DSP contains a delay element for each channel thus limiting the number of delay data which are retrieved from the delay memory during one sampling period. As the result, if a multiplicity of channels are used, the reflected sound data will no more be increased.

SUMMARY OF THE INVENTION

It is an object of the present invention to provide an improved sound field compensating apparatus capable of producing more numbers of the reflected sound data for compensation.

A sound field compensating apparatus according to the present invention contains FIR filters, each filter having delay means for producing a plurality of different delay time data through delaying the input audio signal for each sampling data with the use of a delay memory and multiplier and adder means for multiplying the factor of each delay data by the factor of a coefficient to produce a series of reflected sound data and adding the reflected sound data together. More particularly, each delay means in the FIR filter is associated with a multiplicity of the multiplier and adder means for producing a plurality of FIR filter output signals.

In operation, delay data produced by one of the delay means in the FIR filter is appropriated for common use in multi-channels and thus, the maximum delay time of the delay data will be lengthened without increasing the number of delay data retrieving actions per sampling period on the delay memory. Hence, an acceptable number of the reflected sound data can be obtained for each channel.

DETAILED DESCRIPTION OF THE PREFERRED EMBODIMENT

Figure 1:
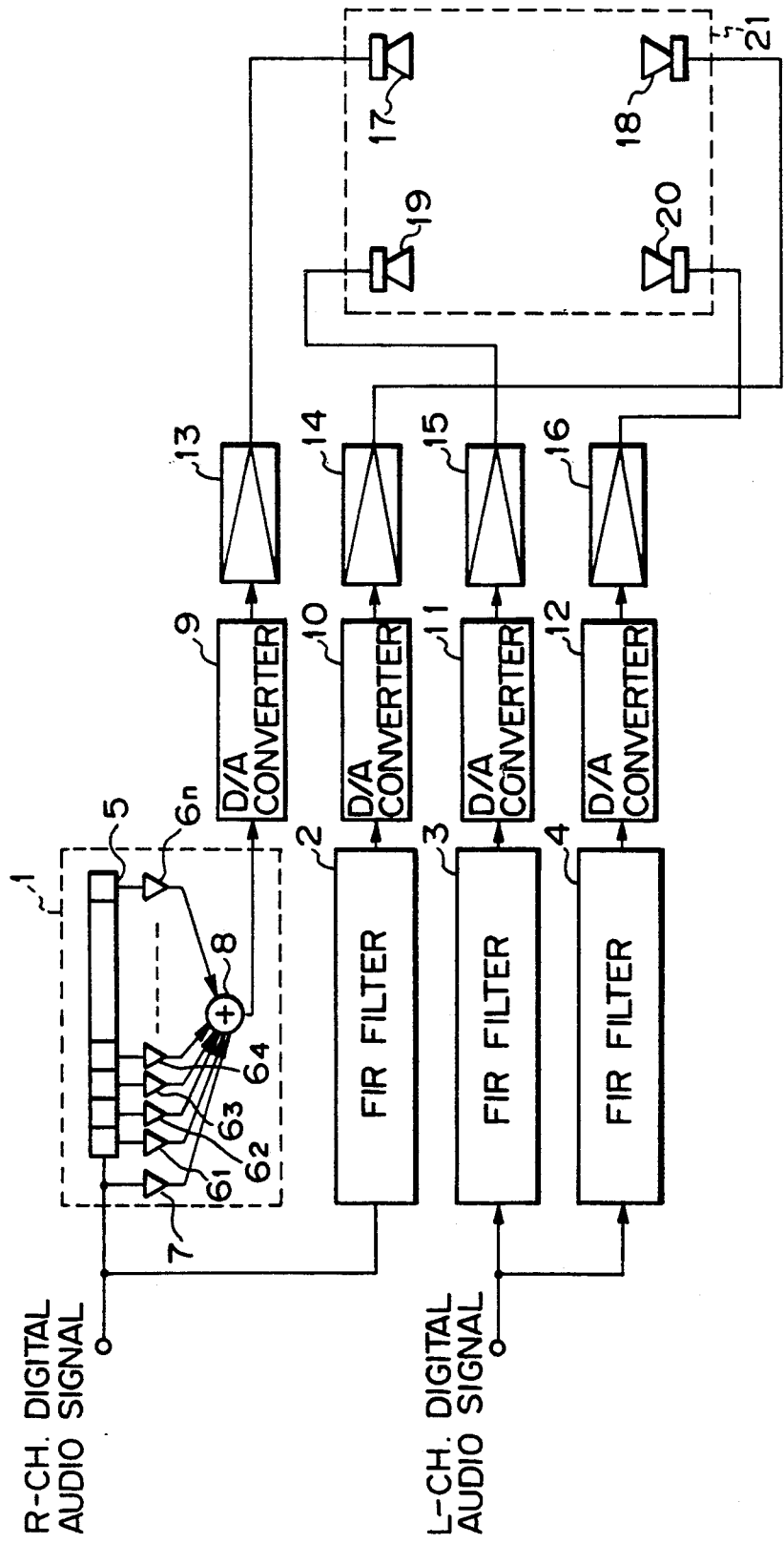
FIG. 1 is a block diagram showing a conventional sound field compensating apparatus.

FIG. 1 illustrates a conventional circuit realized by the action of a DSP. This circuit contains four of FIR filters 1 to 4. In operation, right-channel digital audio signals are fed to the two FIR filters 1 and 4 and left-channel digital audio signals to the other two FIR filters 2 and 3. If the input is analog audio signals, it is analog-to-digital converted prior to the introduction.

The four FIR filters 1 to 4 are all the same in construction and the FIR filter 1 only is shown in more detail. The input digital audio signal or input signal data is first supplied to a delay element 5 in the FIR filter 1. The delay element 5 has a row of output terminals for delivery of a plurality of delay signals. The output terminals of the delay element 5 are coupled to a corresponding number of multipliers $6_1$ to $6_n$ ($n$ is the number of the output terminals). Each of the multipliers $6_1$ to $6_n$ produces a reflected sound data through multiplying the factor of a delay signal from the output terminal by the factor of a coefficient. Also, a multiplier 7 is provided for multiplication of an input signal data, which carries a direct sound data, by a coefficient. The reflected sound data from the multipliers $6_1$ to $6_n$ and 7 are all fed to an adder 8 where they are added up together. A resultant output signal of the adder 8 contains both the direct and reflected sound data and will be delivered as the output signal of the FIR filter 1.

The output signals of the four FIR filters 1 to 4 are converted by D/A converters 9 to 12 respectively to analog signals which are then supplied to amplifiers 13 to 16. The amplifier 13 is arranged for driving a right-front channel speaker 17, the amplifier 14 a right-rear channel speaker 18, the amplifier 15 a left-front channel speaker 19, and the amplifier 16 a left-rear channel speaker 20. The four speakers 17 to 20 are installed in a room 21, e.g. the passenger space of a vehicle.

As apparent from the foregoing arrangement of the conventional sound field compensating apparatus with a DSP, each channel signal occupies one delay element. However, the number of delay data to be retrieved in one sampling period from a delay memory is strictly limited. When the number of channels is increased, a desired number of the reflected sound data will no longer be obtained.

Figure 2:
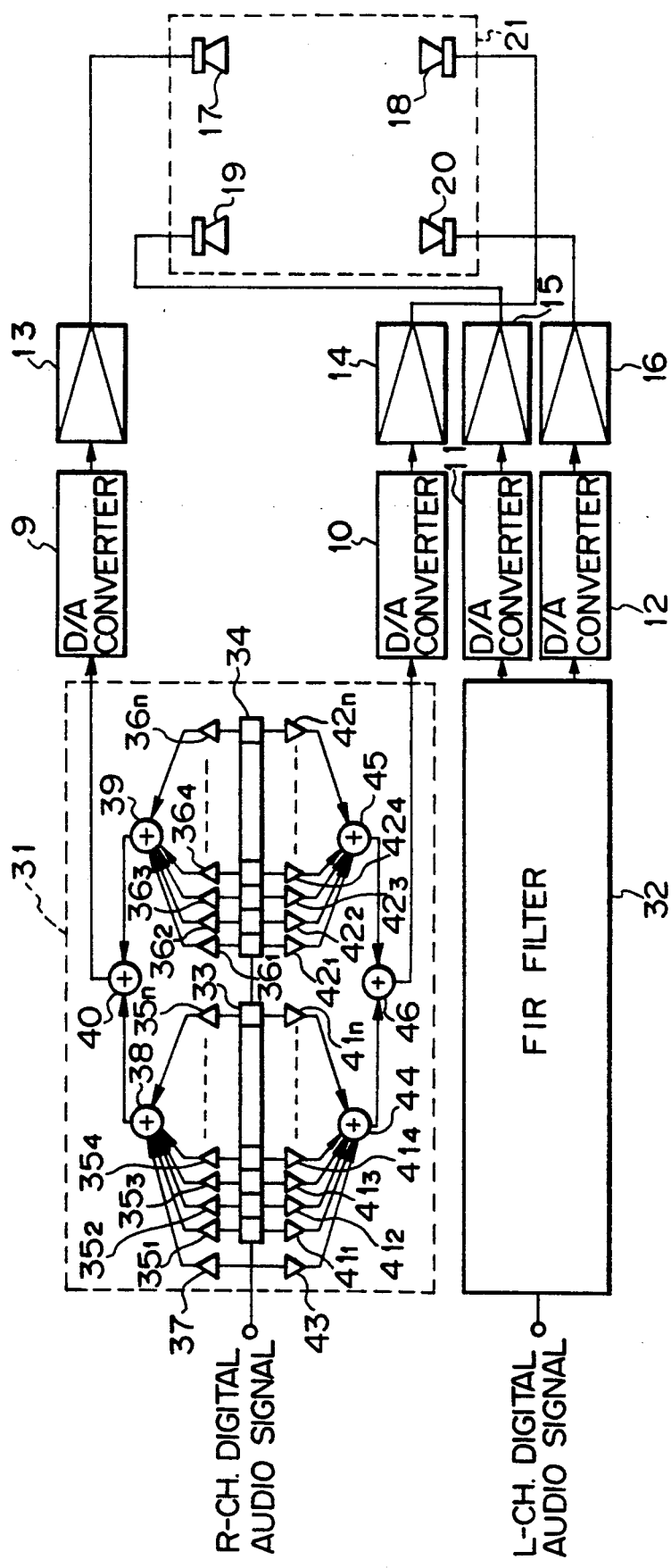
FIG. 2 is a block diagram showing a preferred embodiment of the present invention.

One embodiment of the present invention intended to solve that problem will now be described in detail. FIG. 2 shows a sound compensating apparatus according to the present invention, which contains a couple of FIR filters 31 and 32 realized by the action of a DSP. The two FIR filters 31 and 32 are the same in internal arrangement and the arrangement of the FIR filter 31 will be explained. The FIR filter 31 also contains a couple of delay elements 33 and 34 similar to the delay element 5 shown in FIG. 1. The two delay elements 33 and 34 are coupled in series and a delay data from the delay element 33, which carries a maximum delay, is transferred as the input data to the delay element 34. Also, each of the delay elements 33 and 34 has a row of output terminals for delivery of a plurality of delay signals Although the two output terminal rows of the delay elements 33 and 34 are aligned lengthwise (in the time direction) as portrayed in FIG. 2, two output terminals at same position in the time direction generate equal delay data. The delay element 33 is then coupled at one of the two output ends to a corresponding number of multipliers $35_l$ to $35_n$ and the delay element 34 to a corresponding number of multipliers $36_l$ to $36_n$. Each of the multipliers $35_1$ to $35_n$ produces a reflected sound data through multiplying the factor of a delay data from the corresponding output terminal of the delay element 33 by the factor of a coefficient. Also, a further multiplier 37 is provided for multiplication of the direct sound data of an input signal by the factor of a coefficient. The output reflected sound data of the multipliers $35_l$ to $35_n$ and the output data of the multiplier 37 are then fed to an adder 38 where they are added up together. Similarly, the output data of the multipliers $36_l$ to $36_n$ are fed to another adder 39 for addition. Two data outputs from the adders 38 and 39 are further added together by an adder 40. An output signal from the adder 40, which contains both the direct and reflected sound data, is then delivered as one of the two output signals of the FIR filter 31.

On the other hand, the output terminals of the delay element 33 are coupled at the other terminal to a corresponding number of multipliers $41_l$ to $41_n$ and the output terminals of the delay element 34 to a corresponding number of multipliers $42_l$ to $42_n$. Each of the multipliers $41_l$ to $41_n$ produces a reflected sound data through multiplying the factor of a delay data from the corresponding output terminal of the delay element 33 by the factor of a coefficient. Also, a further multiplier 43 is provided for multiplication of the direct sound data of in input signal by the factor of a coefficient. The reflected sound data outputs of the multipliers $41_l$ to $41_n$ and the data output of the multiplier 43 are then fed to an adder 44 where they are added up together. Similarly, the output data of the multipliers $42_l$ to $42_n$ are fed to another adder 45 for addition. Two output data from the adders 44 and 45 are further added together by an adder 46. An output signal from the adder 46, which contains both the direct and reflected sound data, is then delivered as the other output signal of the FIR filter 31.

The output signals from the two FIR filters 31 and 32 are converted by D/A converters 9 to 12 respectively into analog signals which are in turn fed to four amplifiers 13 to 16. More specifically, the two output signals of the FIR filter 31 are supplied to the D/A converters 9 and 10 respectively. The D/A converter 9 is coupled to the amplifier 13 which drives a right-front channel speaker 17 and the D/A converter 10 is coupled to the amplifier 14 which drives a right-rear channel speaker 18. Equally, the amplifiers 15 and 16 are to drive a left-front 19 and a left-rear channel speaker 20 respectively. The arrangement of the D/A converters 9 to 12, the amplifiers 13 to 16, and the loudspeakers 17 to 20 is identical to that of the conventional apparatus shown in FIG. 1.

The arrangement of a DSP for realizing the foregoing FIR filter circuit will then be described.

Figure 3:
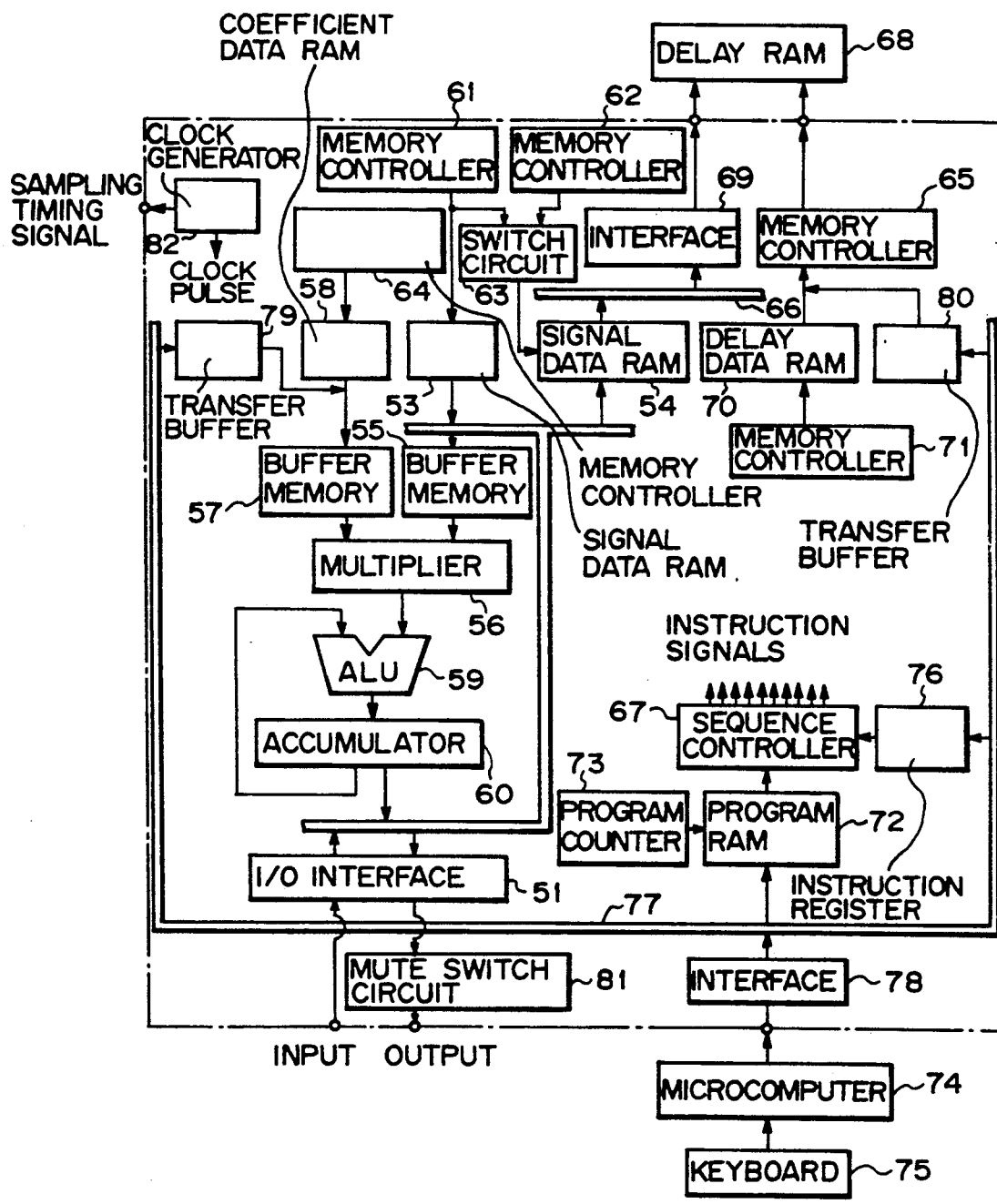
FIG. 3 is a block diagram showing the arrangement of a DSP in the embodiment shown in FIG. 2.

As shown in FIG. 3, a digital audio signal is introduced to an I/0 interface 51 of the DSP. The I/0 interface 51 is coupled to a first data bus 52 which is in turn connected to two signal data RAMs 53 and 54. The first data bus 52 is also coupled to a buffer memory 55 of which output is connected to one of the two inputs of a multiplier 56. The other input of the multiplier 56 is coupled to another buffer memory 57 provided for holding coefficient data The buffer memory 57 is further coupled to a coefficient data RAM 58 for storage of a multiplicity of coefficient data. There is provided an ALU 59 for arithmetic operation, e.g. accumulation, of numerical outputs from the multiplier 56 which is coupled to one of the two inputs thereof The other input of the ALU 59 is connected to the output of an accumulator 60 provided for holding numerical outputs of the ALU 59. The output of the accumulator 60 is communicated to the first data bus 52.

The signal data RAM 53 is further coupled to a memory controller circuit 61 which produces control signals for control of data to be written into and read from a designated address of the RAM 53. Also, the signal data RAM 54 is coupled by a switch circuit 63 to a memory controller circuit 62 which is identical in performance to the memory controller circuit 61. The switch circuit 63, upon receiving a control signal from the memory controller circuit 61, actuates the signal data RAM 54 to perform data write and read operation on a designated address. The coefficient data RAM 58 is connected to a corresponding memory controller circuit 64 which is also identical in performance to the memory controller circuit 61.

Figure 4:
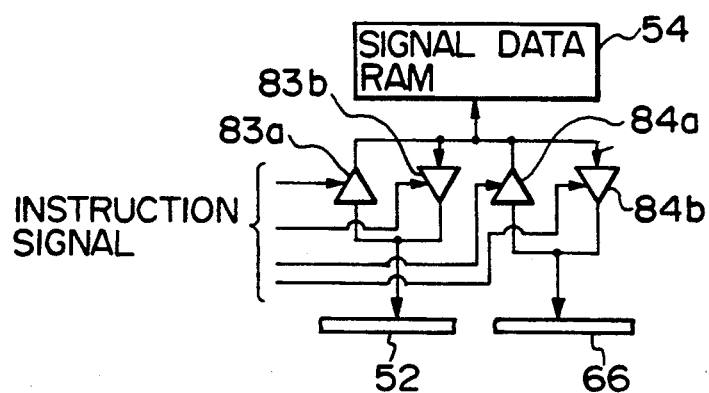
FIG. 4 is a circuit diagram explaining a part of the DSP portrayed in FIG. 3.

The signal data RAM 54 is further communicated to a second data bus 66. In more particular, a pair of three-state buffers 83a and 83b are interposed between the signal data RAM 54 and the first data bus 52, as best shown in FIG. 4. Also, a pair of three-state buffers 84a and 84b are interposed between the signal data RAM 54 and the second data bus 66. The state buffers 83a, 83b, 84a, and 84b are turned on respectively in response to instruction signals from a sequence controller 67 which will be described in more detail later. When a signal data from the first data bus 52 is written into the RAM 54, the state buffer 83a is switched on. When a signal data is transferred from the RAM 54 to the first data bus 52, the state buffer 83b is turned on. Similarly, the state buffer 84a is switched on for writing a signal data from the second data bus 66 into the RAM 54 and the state buffer 84b is turned on for transferring a signal data from the RAM 54 to the second data bus 66. Only one of the four buffers 83a, 83b, 84a, and 84b is activated at a time by the instruction signal.

The second data bus 66 is coupled to an interface 69 provided for data exchange with an externally provided delay RAM 68. The delay RAM 68 is a delay memory for producing a delay signal data of audio signal data. If the storage capacity of the delay RAM 68 is greater, a more delayed signal of the data will be produced. Also, a memory controller circuit 65 is provided for designating an address of the delay RAM 68 for read and write action. The memory controller circuit 65 is also coupled to a delay time data RAM 70 which is controlled by a memory controller circuit 71 for read and write operation of delay time data.

The two interfaces 51 and 69, the multiplier 56, the two buffer memories 55 and 57, the ALU 59, the accumulator 60, the five memory controller circuits 61, 62, 64, 65, and 71, and the switch circuit 63 are all controlled by the sequence controller 67. The sequence controller 67 is coupled to a program RAM 72 and actuated in accordance with a program stored in the program RAM 72. The program RAM 72 is then connected to a program counter 73 so that in response to addition of each count value in the program counter 73, an instruction code for performing a step corresponding to the value is read from the program RAM 72 and fed to the sequence controller 67. Also, the sequence controller 67 is communicated to a register 76 for holding a plurality of instructions supplied from a microcomputer 74.

Both the program RAM 72 and the register 76 are coupled to a main bus 77 which extends across an interface 78 to the microcomputer 74. The main bus 77 is also connected to a couple of transfer buffers 79 and 80. The transfer buffer 79 is provided for temporarily holding coefficient data supplied from the microcomputer 74 prior to storage in the coefficient data RAM 58. The transfer buffer 80 is for temporality holding delay time data supplied from the microcomputer 74 prior to storage in the delay time data RAM 70.

The microcomputer 74 comprises microprocessors, RAMs, ROMs, and interfaces (which all are not shown) and is provided with a keyboard 75. The keyboard 75 has a multiplicity of keys thereon (not shown) including mode keys for selection of a sound field mode from e.g. hall 1, hall 2, and so on, sound level control keys, and mute keys. The microcomputer 74 carries in its RAMs a number of sequence controlling programs for operation on the sequence controller 67, groups of coefficient data associated with initial reflected sound levels which are to be transferred to the coefficient data RAM 58, and groups of delay time data for setting of the addresses to be read which are to be transferred to the delay time data RAM 70, as well as a DSP control program which is operated by the microprocessor 74 itself.

The DSP also contains a clock generator 82 which distributes clock pulses to the sequence controller 67, the program counter 73 and the microcomputer 74. Some of the clock pulses from the clock generator 82 are used as timing signals for sampling action in the A/D converters during conversion of analog audio signals to digital forms.

An audio signal output from the I/O interface 51 is fed to a mute switch circuit 81. The on/off operation of the mute switch circuit 81 is controlled by instruction signals delivered from the sequence controller 67. As understood, there are provided a corresponding number to channels of the I/O interfaces 51 although one is illustrated in FIG. 3.

In operation, the sequence controller 67 produces a variety of instruction signals other than the instruction signals for on and off operation of the mute switch circuit 81. They are: instruction signals for transferring groups of coefficient data from the transfer buffer 79 to the coefficient data RAM 58; instruction signals for transferring groups of address data from the transfer buffer 80 to the delay time data RAM 70; instruction signals for transferring audio signal data from the I/0 interface 51 to corresponding address locations in the signal data RAMs 53 and 54; instruction signals for retrieving signal data from designated address locations in the signal data RAMs 53 and 54 and feeding them to the buffer memory 55; instruction signals for retrieving signal data from designated address locations in the signal data RAM 58 and feeding them to the buffer memory 57; instruction signals for actuating the ALU 59 to perform a variety of arithmetic operation; instruction signals for transferring signal data from the accumulator 60 to corresponding address locations in the signal data RAMs 53 and 54 or to the buffer memory 55; instruction signals for transferring signal data from designated address locations in the signal data RAM 54 to write address location in the external delay RAM 68; instruction signals for transferring signal data from designated delay address locations in the external RAM 68 to corresponding address locations in the signal data RAM 54; and instruction signals for reset action in order to initialize the signal data RAMs 53 and 54 and the external delay RAM 68. Those instruction signals are delivered at appropriate timing in accordance with commands from the microcomputer 74 or the program stored in the program RAM 72. Each command signal from the microcomputer 74 is held by the instruction register 76. Accordingly, the sequence controller 67 is kept monitoring the content of register 76 during operation with the program and upon finding a command from the microcomputer 74, interrupts the operation and produces an instruction signal corresponding to the command. Once the instruction signal is produced, the corresponding command held in the register 76 will be canceled by e.g. the sequence controller 67.

The signal data processing in the DSP will now be explained. A series of digital audio signals received to the DSP are supplied across the I/0 interface 51 to the first data bus 52. The data groups of the signals supplied to the first data bus 52 are stored in the signal data RAM 53 or 54. Each signal data in the RAM 54 is in sequence transferred via the second data bus 66 to an output register (not shown) in the interface 69 and then, stored in the location of the external memory 68 defined by write address. The write address is determined by the memory controller circuit 65 and selected in turn in addresses corresponding to storage locations in the external RAM 68. When designated read address is released, signal data is retrieved from the corresponding location in the external RAM 68 and fed to an input register (not shown) of the interface 69. The read address is determined by the write address associated with a delay time data supplied to the memory controller circuit 65, because the delay time data is retrieved from the delay time data RAM 70 by the memory controller circuit 71 and fed to the memory controller circuit 65. More specifically, the delay time is determined by an interval between the write and read actions on the RAM 68 controlled by the delay time data. The signal data held at the input register of the interface 69 is then transferred across the second data bus 66 back to the signal data RAM 54. Accordingly, delay data for sound field control are given by the interaction between the signal data RAM 54 and the external RAM 68.

The coefficient data retrieved from the coefficient data RAM 58 is supplied to the buffer memory 57 for storage. Under timing control of the sequence controller 67, relevant signal data are transferred from the RAM 53, RAM 54, or accumulator 60 to the buffer memory 55. Then, the multiplier 56 performs multiplication on the signal data from the buffer memory 55 and the coefficient data from the buffer memory 57. For example, multiplication and summation of signal data groups $d_1, d_2 \ldots d_n$ and coefficient data groups $k_1, k_2 \ldots k_n$ is executed by a sequence. First, $d_1$ is held in the buffer memory 55 while $k_1$ is held in the buffer memory 57. The multiplier 56 then produces $k_1 \cdot d_1$. At the ALU 59, 0 is added to. A resultant value is now stored in the accumulator 60. Similarly, is held in the buffer memory 55 while $k_2$ is held in the buffer memory 57. The multiplier 56 then produces $k_2 \cdot d_2$. Upon receiving $k_1 \cdot d_1$, the ALU 59 produces $k_1 \cdot d_1 + k_2 \cdot d_2$. After repeating this procedure $$\sum_{i=1}^{n} k_i \cdot d_i$$

is obtained. This represents the action of the FIR filters 31 and 32.

The number of data read operations in one sampling period from the delay RAM 68 is far smaller than the number of multiplying actions on the multiplier 56 of the DSP. For example, during 120 of the multiplying actions, the reading of data from the delay RAM 68 is carried out 30 times. Accordingly, the arrangement of the FIR filters 31 and 32 shown in FIG. 2 allows the maximum delay time to be doubled in length without increasing the number of the data read operations on the delay RAM 68. Also, the compensating signals for reflected sound can be increased for each channel. The number of the multiplying actions will increase from 30 to 60 which is still within a permissive level of the DSP.

Figure 5:
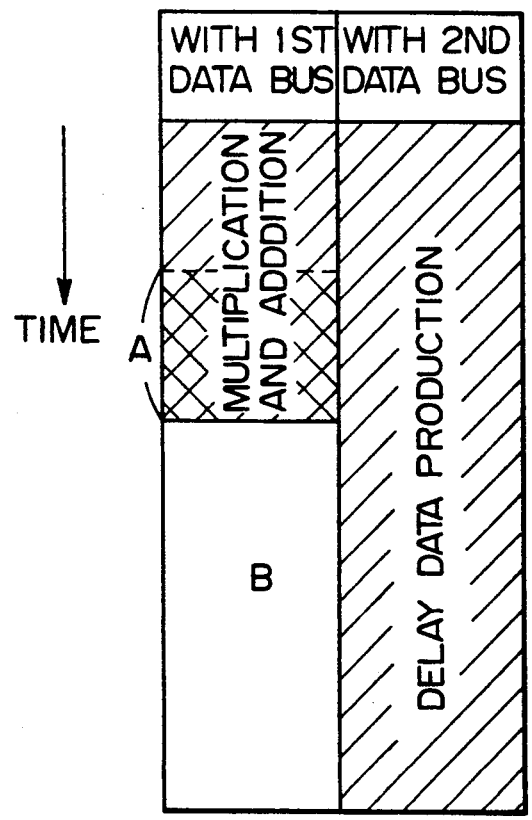
FIG. 5 is a diagram showing the extension of a processing program during one sampling period.

The DSP according to the present invention contains the first data bus 52 for transfer of data about multiplication and addition and the second data bus 66 for transfer of data about delay data production respectively, thus allowing the program processing in one sampling period to be carried out with both the production and the multiplication and addition of the delay data being conducted in parallel relationship to each other, as shown in FIG. 5. More specifically, the delay data produced in the preceding sampling period is processed at the present period for multiplication and addition. While the duration of delay data production remains unchanged as equal to one sampling period due to the same number of the data read operations on the delay RAM 68, the number of the multiplying actions increases from 30 to 60 and thus, the duration for multiplication and addition will be doubled in length as shown in FIG. 5 (where an extended time is denoted by the letter A). However, the rest of the duration, denoted by B, for multiplication and addition with the first data bus 52 remains unused allowing more processing.

Although the outputs of the delay elements in the embodiment are all coupled to their respective multipliers of which data outputs are then summed up, the multipliers may be connected to selective ones of the delay elements for summation of corresponding outputs of the multipliers. In other words, desired outputs of the delay elements may selectively be used.

Also, the direct sound and the compensating sound are mixed in the form of electrical signals for emission from the speaker(s) in the embodiment. The two sounds may directly be emitted from their respective speakers for compensation without preparatory mixture of their corresponding signals.

As set forth above, the sound field compensating apparatus of the present invention contains FIR filters, each filter comprising delay means for producing a plurality of different delay time data through delaying the input audio signal for each sampling data with the use of a delay memory and multiplier and adder means for multiplying the factor of each delay data by the factor of a coefficient to produce a series of reflected sound data and summing the reflected sound data together. More particularly, each delay means in the FIR filter is associated with a multiplicity of the multiplier and adder means. Delay data produced by one of the delay means in the FIR filter, which is realized by the action of the DSP, is appropriated for common use in multichannels and thus, the maximum delay time of the delay data will be lengthened without increasing the number of delay data retrieving actions per sampling period on the delay memory. Hence, an acceptable number of the reflected sound signals can be obtained for each channel. Also, the FIR filter if arranged in the form of a hardware device with no use of the DSP allows the maximum delay time to be enlarged in length without increasing the number of interior components so that a more number of the reflected sound signals can be produced.

What is claimed is:

1. A sound field compensating apparatus comprising; a plurality of FIR filters, each FIR filter having
    (a) delay means, which includes a row of output terminals, for producing a plurality of different delay time data, one at each output terminal, by delaying the input audio signal for each sampling data
    (b) multiplier and adder means for multiplying each delay time data by a respective coefficient in order to produce a series of reflected sound data and for adding said reflected sound data together;
   means for obtaining driving signals for driving respective loudspeakers in accordance with output signals of said FIR filters, and further characterized in that
   each of said output terminals of said delay means of said FIR filter is connected to a multiplicity of the multiplier and adder means for production of a plurality of output signals for each output terminal in said row of output terminals.

2. A sound field compensating apparatus according to claim 1, wherein the FIR filters are realized by the action of a digital signal processor.

3. A sound field compensating apparatus according to claim 2, wherein the digital signal processor has at least two separate data buses so that the production of the delay data is executed using one of the two data bus and the multiplication and addition of the delay data is executed using the other data bus in accordance with a parallel processing program.

* * * * *